United States Patent
Jo

(10) Patent No.: US 10,170,181 B2
(45) Date of Patent: Jan. 1, 2019

(54) VARIABLE RESISTANCE MEMORY DEVICE INCLUDING BIDIRECTIONAL SWITCH, MEMORY SYSTEM INCLUDING THE SAME, AND OPERATING METHOD THEREOF

(71) Applicant: Sungkyu Jo, Hwaseong-si (KR)

(72) Inventor: Sungkyu Jo, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 34 days.

(21) Appl. No.: 15/614,730

(22) Filed: Jun. 6, 2017

(65) Prior Publication Data
US 2018/0144793 A1 May 24, 2018

(30) Foreign Application Priority Data
Oct. 10, 2016 (KR) .......................... 10-2016-0130876

(51) Int. Cl.
*G11C 13/00* (2006.01)

(52) U.S. Cl.
CPC ........ *G11C 13/003* (2013.01); *G11C 13/0002* (2013.01); *G11C 13/0004* (2013.01); *G11C 13/004* (2013.01); *G11C 13/0023* (2013.01); *G11C 13/0033* (2013.01); *G11C 13/0061* (2013.01); *G11C 13/0069* (2013.01); *G11C 2013/0073* (2013.01)

(58) Field of Classification Search
CPC .................................................. G11C 13/0069
USPC ....................................................... 365/148
See application file for complete search history.

(56) References Cited

U.S. PATENT DOCUMENTS

| | | | |
|---|---|---|---|
| 5,615,162 A | 3/1997 | Houston | |
| 7,038,961 B2 | 5/2006 | Sakata et al. | |
| 7,206,216 B2* | 4/2007 | Osada ................ | G11C 13/0004 365/148 |
| 7,417,887 B2 | 8/2008 | Cho et al. | |
| 7,835,174 B2* | 11/2010 | Tokiwa .................. | G11C 13/00 365/100 |
| 7,835,199 B2 | 11/2010 | Choi et al. | |
| 7,965,546 B2 | 6/2011 | Lee et al. | |
| 8,391,047 B2* | 3/2013 | Maejima ............ | G11C 13/0004 365/148 |
| 8,929,120 B2* | 1/2015 | Yip ......................... | G11C 7/18 365/189.11 |
| 9,368,170 B2 | 6/2016 | Matsuoka | |
| 2015/0032979 A1 | 1/2015 | Li et al. | |

FOREIGN PATENT DOCUMENTS

WO WO2010/125852 A1 11/2010

* cited by examiner

*Primary Examiner* — Son Mai
(74) *Attorney, Agent, or Firm* — Volentine, Whitt & Francos, PLLC

(57) ABSTRACT

A memory device includes: a cell array connected to a plurality of word lines and bit lines, the cell array including a plurality of memory cells each including a variable resistance element and a bidirectional selection element; a selection circuit that selects a selected word line and a selected bit line; and control logic that controls the selection circuit such that in a stand-by state, wherein the word lines and the bit lines which are connected to memory cells of a first area of the cell array are maintained in a discharge state, and the word lines and bit lines which are connected to memory cells of a second area of the cell array are maintained in a precharge state.

20 Claims, 15 Drawing Sheets

VARIABLE RESISTANCE MEMORY DEVICE INCLUDING BIDIRECTIONAL SWITCH, MEMORY SYSTEM INCLUDING THE SAME, AND OPERATING METHOD THEREOF

CROSS-REFERENCE TO RELATED APPLICATIONS

A claim for priority under 35 U.S.C. § 119 is made to Korean Patent Application No. 10-2016-0130876 filed Oct. 10, 2016, in the Korean Intellectual Property Office, the entire contents of which are hereby incorporated by reference.

BACKGROUND

Embodiments of the inventive concept disclosed herein relate to a semiconductor memory device, and more particularly, to a variable resistance memory device having a bidirectional switch, a memory system including the same, and an operating method thereof.

Semiconductor memory devices are classified into a volatile semiconductor memory device and a nonvolatile semiconductor memory device. The volatile semiconductor memory device is fast in terms of read and write speeds, but it loses data stored therein when power is not supplied thereto. In contrast, the nonvolatile semiconductor memory device retains data stored therein even when power is not supplied thereto. For this reason, the nonvolatile semiconductor memory device is used to store information that has to be retained regardless of whether power is supplied thereto.

There is an increasing demand for a semiconductor memory that is randomly accessible and implements high integration and a large capacity. A typical example of the semiconductor memory device is a flash memory that is mainly used in a portable electronic device currently. In addition, there is being developed a semiconductor memory device in which a DRAM capacitor is replaced with a nonvolatile material. Next-generation memory devices that are in the spotlight while satisfying the above-described requirements include a phase change random access memory (PRAM), a nano floating gate memory (NFGM), a polymer RAM (PoRAM), a magnetic RAM (MRAM), a ferroelectric RAM (FeRAM), a resistive RAM (RRAM), etc.

In the case of the PRAM, unselected word lines are precharged in advance even in a stand-by state to support a high access speed. In addition, a bidirectional switch (or diode) is being used to form a PRAM cell of a three-dimensional structure. When the bidirectional switch is used, a word line has to be precharged with a higher voltage than when a unidirectional switch is used. In this case, a bit line may be precharged with the same voltage level as that of the word line to prevent current leakage. Accordingly, in a highly-integrated PRAM, it is necessary to prevent a potential leakage current due to precharging of the word line and the bit line.

SUMMARY

Embodiments of the inventive concept provide a variable resistance memory device having a bidirectional switch for reducing current leakage, a memory system including the same, and an operating method thereof.

According to an aspect of an embodiment, a memory device includes: a plurality of word lines and a plurality of bit lines; a cell array connected to the plurality of word lines and plurality of bit lines including a plurality of memory cells each including a variable resistance element and a bidirectional selection element, the cell array having a first area including at least some of the memory cells and further having a second area including at least some others of the memory cells; a selection circuit which is configured to select a selected word line of the plurality of word lines and to select a selected bit line of the plurality of bit lines; and control logic which is configured to control the selection circuit such that in a stand-by state, the word lines and the bit lines connected to the memory cells of the first area of the cell array are maintained at a discharge state do as to have a discharge voltage, and the word lines and the bit lines of the second area of the cell array are maintained at a precharge state so as to have a precharge voltage which is greater than the discharge voltage.

According to another aspect of an embodiment, an operating method is provided for a memory device which includes a plurality of memory cells each comprising a variable resistance element and a bidirectional selection element. The operating method includes: dividing the memory cells into a first area including at least some of the memory cells and a second area including at least some others of the memory cells; in a standby state, discharging word lines and bit lines connected to the memory cells of the first area to a discharge voltage, and precharging word lines and bit lines connected to the memory cells of the second area to a precharge voltage which is greater than the discharge voltage; detecting a request for an access to the memory device; and when an address included in the access request corresponds to one or more selected memory cells of the first area of the memory device: sending to the memory device a prefix command for precharging at least one of the word lines and at least one of the bit lines connected to the one or more selected memory cells of the first area of the memory device, and sending to the memory device an access command corresponding to the access request.

According to another aspect of an embodiment, a memory system includes: a memory device that includes a plurality of memory cells each comprising a variable resistance element and a bidirectional selection element, the memory device controlling the memory cells such that the memory cells are divided into a first area that remains at a discharge state in a stand-by state and a second area that remains at a precharge state in the stand-by state; and a host that designates the first area and the second area by using a mapping table. When write data is written to one or memory cells in the second area, the host maps an address of the write data onto the first area in the mapping table during a specific time, and then remaps the address onto the second area.

According to yet another aspect of the invention, a method includes: maintaining in a host a mapping table for a memory device, which memory device includes a plurality of memory cells each comprising a variable resistance element and a bidirectional selection element, the mapping table including a first group designating one or more addresses of a first area of the memory device including some of the memory cells, and a second group designating one or more addresses of a second area of the memory device including some others of the memory cells, wherein in a standby state, the memory device discharges word lines and bit lines connected to the memory cells of the first area to a discharge voltage, and precharges word lines and bit lines connected to the memory cells of the second area to a precharge voltage which is greater than the discharge voltage; detecting a request for an access to the memory device;

when an address included in the access request corresponds to one or more selected memory cells of the first area of the memory device, as indicated by the mapping table: sending to the memory device a prefix command for precharging at least one of the word lines and at least one of the bit lines connected to the one or more selected memory cells of the first area of the memory device, and after sending the prefix command, sending an access command for accessing the one or more selected memory cells of the first area of the memory device; and when the address included in the access request corresponds to one or more selected memory cells of the second area of the memory device, as indicated by the mapping table: sending an access command for accessing the one or more selected memory cells of the second area of the memory device, as indicated by the mapping table, without first sending a prefix command for precharging one or more word lines and one or more bit lines connected to the one or more selected memory cells in the second area.

BRIEF DESCRIPTION OF THE DRAWINGS

The above and other objects and features will become apparent from the following description with reference to the following figures, wherein like reference numerals refer to like parts throughout the various figures unless otherwise specified.

DETAILED DESCRIPTION

Figure 1:
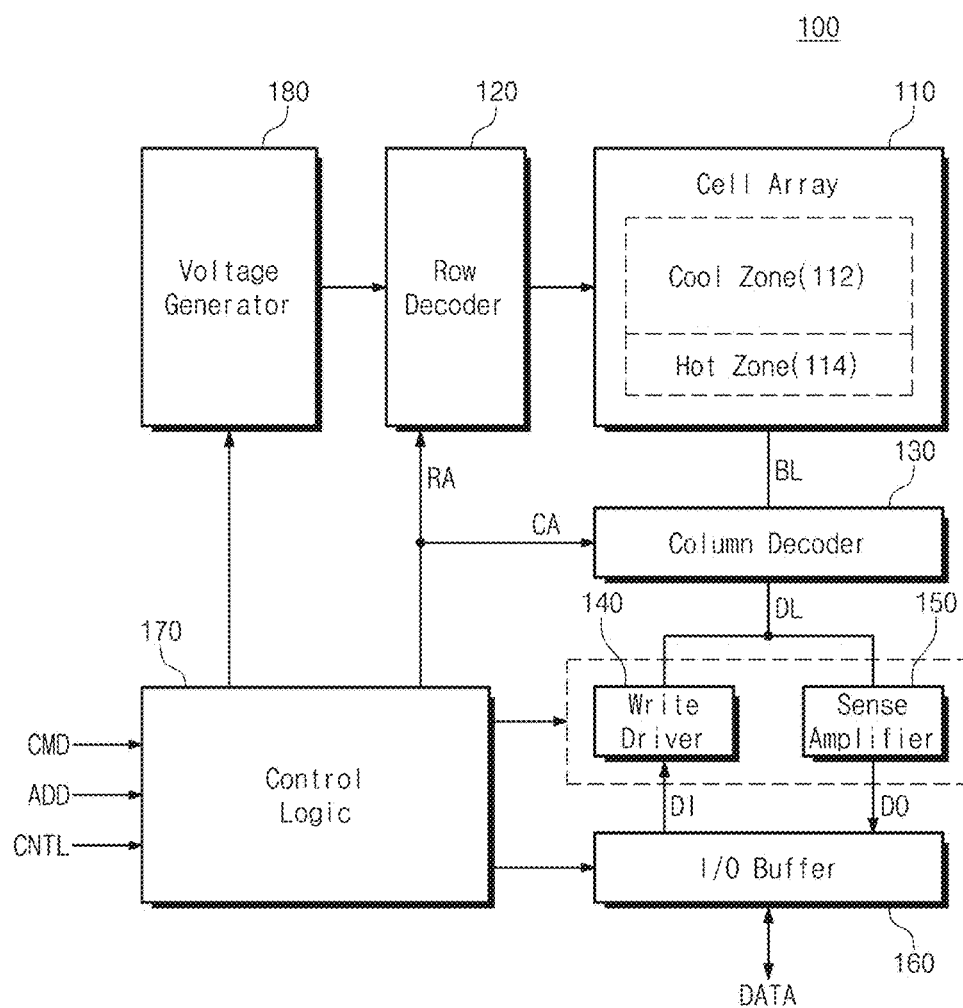
FIG. 1 is a block diagram illustrating an embodiment of a phase change memory device.

It should be understood that both the foregoing general description and the following detailed description are provided as examples, for illustration and not for limiting the scope and spirit of the claimed invention. Reference will now be made in detail to embodiments of the inventive concept, examples of which are illustrated in the accompanying drawings. Wherever possible, the same reference numbers are used in the drawings and the description to refer to the same or like parts.

Below, a phase change memory device may be used as an example of a variable resistance memory device for describing features and functions of the inventive concept. However, one skilled in the art may easily understand other features and performances from information disclosed herein. For example, a technology disclosed in this specification, according to an embodiment of the inventive concept, may be used in an MRAM, a ReRAM, a FRAM, a NOR flash memory, etc. The inventive concept may be implemented or applied through other embodiments. In addition, the detailed description may be changed or modified according to view points and applications without departing from the claims, the scope and spirit, and any other purposes of the inventive concept.

FIG. 1 is a block diagram illustrating an embodiment of a phase change memory device. Referring to FIG. 1, a phase change memory device 100 may include a cell array 110, a row decoder 120, a column decoder 130, a write driver 140, a sense amplifier 150, an input output buffer 160, control logic 170, and a voltage generator 180.

Cell array 110 includes a plurality of phase change memory cells that are arranged in rows and columns According to an embodiment, each phase change memory cell includes a variable resistance element and a selection element. In particular, according to an embodiment, each phase change memory cell includes a bidirectional switch as the selection element. The bidirectional switch may be implemented, for example, with a bidirectional diode. The phase change memory cells may be controlled in units of tiles. Each tile unit may be connected to bit lines and word lines. In particular, according to an embodiment, cell array 110 is divided into a cool zone, or first area, 112 and a hot zone, or second area, 114 based on whether a bit line and a word line are precharged in a stand-by state.

Word lines and bit lines of memory cells that belong to cool zone 112 remain at a discharge state in a stand-by state. That is, the word lines and the bit lines of the memory cells included in cool zone 112 remain at a ground level Vss or 0 V in the stand-by state. In contrast, one or more word lines and bit lines of memory cells that belong to hot zone 114 remain at a precharge state even in the stand-by state. The word line(s) and the bit lines of the memory cells included in hot zone 114 may be controlled to maintain a uniform voltage or a precharge voltage Vpre in the stand-by state, where, beneficially, Vpre is greater than the ground level Vss or 0 V.

Row decoder 120 may decode a received row address RA to select a word line. Row decoder 120 may provide a word line voltage provided from voltage generator 180 to a selected or unselected word line based on each whether the word line is connected to memory cells in cold zone 112 or hot zone 114. In particular, row decoder 120 may continue to supply the precharge voltage Vpre to one or more word lines connected to memory cells included in hot zone 114 in the stand-by state. In contrast, row decoder 120 may supply the ground voltage Vss or 0 V to the word line(s) connected to memory cells of cool zone 112 in the stand-by state. It may be well understood, of course, that row decoder 120 provides the ground voltage Vss or 0 V to a selected word line regardless of the zone during a data access operation.

Column decoder 130 is connected with memory array 110 through a bit line BL and is connected with write driver circuit 140 or sense amplifier 150 through a data line DL. Column decoder 130 electrically connects a data line and a selected bit line in response to a column address CA. An embodiment is described as column decoder 130 is connected to cell array 110 through the bit line, but it may be well understood that column decoder 130 is connected to cell array 110 through another connection other than the bit line.

Write driver 140 writes input data DI in a selected memory cell. Write driver 140 provides a write pulse to a bit line of the selected memory cell. Write driver 140 may supply a write current I_SET or I_RST through the data line DL in response to a bias signal (not illustrated), a set pulse P_SET, and a reset pulse P_RST provided from a pulse generator (not illustrated) or control logic 170.

Sense amplifier 150 is controlled by control logic 170. Sense amplifier 150 senses data written in a memory cell through a bit line, which is selected by column decoder 130, during a data read operation. Sense amplifier 150 may provide the sensed data DO to input output buffer 160. Write driver 140 and sense amplifier 150 constitute a read/write circuit.

I/O buffer 160 may provide input data DI, which is provided from the outside, to write driver 140. Also, input output buffer 160 may output the sensed data DO provided from sense amplifier 150 to the outside of phase change memory device 100.

Control logic 170 controls an access to cell array 110 in response to a command CMD, a control signal CNTL, and an address ADD from the outside. Control logic 170 differently controls cool zone 112 and hot zone 114 of cell array 110 in the stand-by state where an access to a memory cell is not made. That is, control logic 170 may differently manage precharge states of bit lines and word lines of cool zone 112 and hot zone 114 in the stand-by state. Control logic 170 may control row decoder 120, column decoder 130, voltage generator 180, etc. such that the bit lines and the word lines of the memory cells included in cool zone 112 are maintained at a ground or a discharge state in the stand-by state. In addition, when an access-requested address ADD corresponds to cool zone 112, control logic 170 may perform a write or read operation on one or more selected memory cells after precharging a selected word line and one or more selected bit lines. In another embodiment, control logic 170 may receive a separate command (a prefix command) for precharging the selected word line and one or more selected bit lines of memory cells belonging to cool zone 112. Control logic 170 may precharge one or more word lines and one or more bit lines of cool zone 112, including a word line and a bit line of a selected memory cell, in response to the separate command Voltage generator 180 is controlled by control logic 170 and is configured to generate voltages that are used in row and column decoders 120 and 130, write driver 140, sense amplifier 150, etc. For example, voltage generator 180 may be implemented by using a charge pump. However, it may be well understood that implementation of voltage generator 180 is not limited to this disclosure.

As an embodiment of the inventive concept, cell array 110 may be provided with a three-dimensional (3D) memory array. The 3D memory array may be monolithically formed in one or more physical level(s) of a memory cell array having an active area arranged on a circuit related on a silicon substrate and an operation of memory cells. The circuit related to an operation of memory cells may be located in the substrate or on the substrate. The term "monolithic" means that layers of each level of the array are directly deposited on the layers of each underlying level of the array.

In an embodiment of the inventive concept, the 3D memory array is configured such that a variable resistance element and a switching element constituting at least one memory cell are vertically arranged according to a vertical orientation. Here, the switching element may be implemented with a bidirectional switch.

According to an embodiment, as described above, phase change memory device 100 includes cool zone 112 in which one or more word lines and bit lines are maintained at a ground level in the stand-by state, and hot zone 114 in which one or more word lines and bit lines are maintained at a precharge state in the stand-by state. According to an embodiment, it may be possible to markedly reduce occurrence of a leakage current in a phase change memory cell structure including a bidirectional switch by managing cool zone 112.

Figure 2:
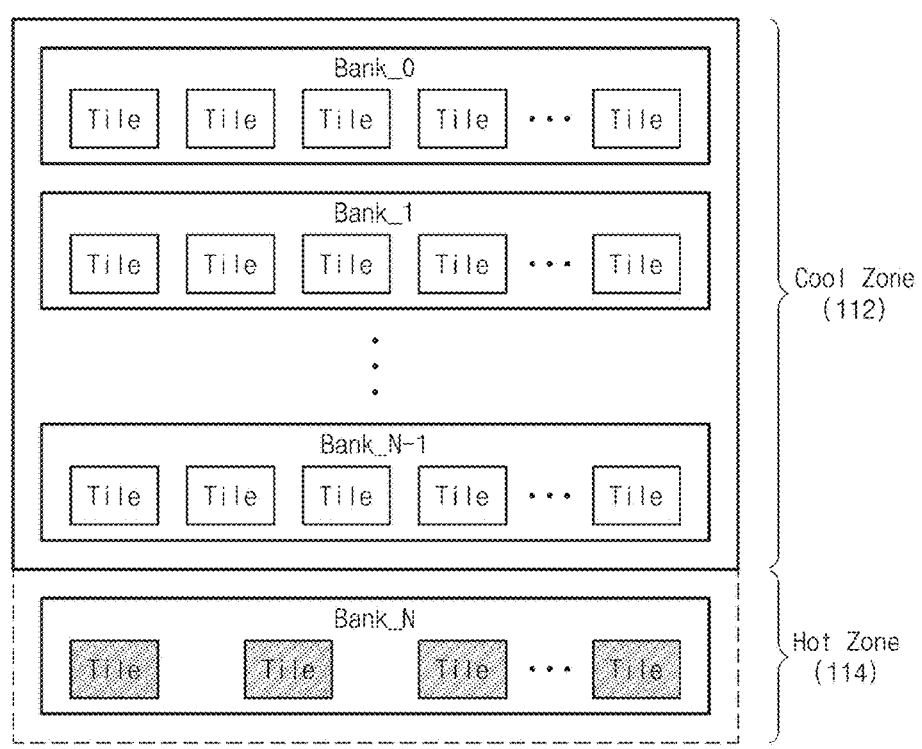
FIG. 2 is a block diagram illustrating an example of a cell array included in the phase change memory device of FIG. 1.

FIG. 2 is a block diagram illustrating an example of cell array 110 included in phase change memory device 100 of FIG. 1. Referring to FIG. 2, cell array 110 may include a plurality of banks Bank_0 to Bank_N. The banks Bank_0 to Bank_N are divided into cool zone 112 and hot zone 114 based on whether to precharge a bit line and a word line in the stand-by state.

The banks Bank_0 to Bank_N-1 may be designated as cool zone 112. That is, word lines and bit lines connected to tiles of each of the banks Bank _0 to Bank_N-1 designated as cool zone 112 may be maintained at a discharge state in the stand-by state. When a request for an access to the banks Bank_0 to Bank_N-1 is made, control logic 170 may precharge bit lines and word lines in units of a bank or a tile of an access-requested memory area. A command indicating precharging of a specific memory area may be provided to precharge cool zone 112. Such embodiments will be described in detail with reference to the following accompanying drawings.

The bank Bank_N may be designated as hot zone 114. That is, word lines and bit lines connected to each tile of the bank Bank_N designated as hot zone 114 may be maintained at a precharged state even in the stand-by state. When a request for an access to hot zone 114 is made, a high-speed response is possible without a delay required for precharging. Here, an embodiment is illustrated and described wherein one bank Bank_N is designated as hot zone 114, but embodiments of the inventive concept may not be limited thereto. Hot zone 114 may be composed of two or more banks. Alternatively, hot zone 114 may be designated in units of tiles each of which is smaller in size than one bank.

Figure 3:
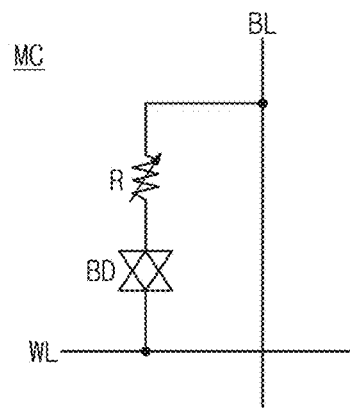
FIG. 3 is a circuit diagram illustrating one memory cell included in the cell array in FIG. 1 or FIG. 2.

FIG. 3 is a circuit diagram illustrating one memory cell included in a cell array in FIG. 1 or 2. Referring to FIG. 3, a memory cell may include a variable resistance element R and a bidirectional selection element BD connected to a bit line BL and a word line WL.

According to an embodiment, the variable resistance element R may have a resistance value, which corresponds to any one of a plurality of resistance states, by an electrical pulse applied thereto. In an embodiment, the variable resistance element R may include a phase change material, of which a crystal (or crystalline) state varies with the amount of current. The phase change material may include various kinds of materials such as GaSb, InSb, InSe, Sb2Te3, GeTe, GeSbTe, GaSeTe, InSbTe, SnSb2Te4, InSbGe, AgInSbTe, (GeSn)SbTe, GeSb(SeTe), and Te81Ge15Sb2S2.

The phase change material may have an amorphous state of relatively great resistance and a crystal state of relatively small resistance. A phase of the phase change material changes by Joule's heat that is generated according to the amount of current. Data may be written by using such phase change. Meanwhile, in another embodiment, the variable resistance element R may include perovskite compounds, a transition metal oxide, magnetic materials, ferromagnetic material, or antiferromagnetic materials instead of a phase change material.

The bidirectional selection element BD may control the supply of a current to the variable resistance element R based on voltages applied to the bit line BL and the word line WL. In an embodiment, the bidirectional selection element BD may be a PN junction or PIN junction diode and is configured such that an anode of the diode is connected to the bit line BL and a cathode thereof is connected to the variable resistance element R. In this case, the diode may be turned on when a voltage difference between the anode and the cathode of the diode is greater than a threshold voltage of the diode, and thus a current may be supplied to the variable resistance element R. In particular, according to an embodiment, the bidirectional selection element BD may be implemented with a bidirectional switching element. It may be possible to block a leakage current, which flows to an unselected resistance cell, through the bidirectional diode BD.

Figure 4:
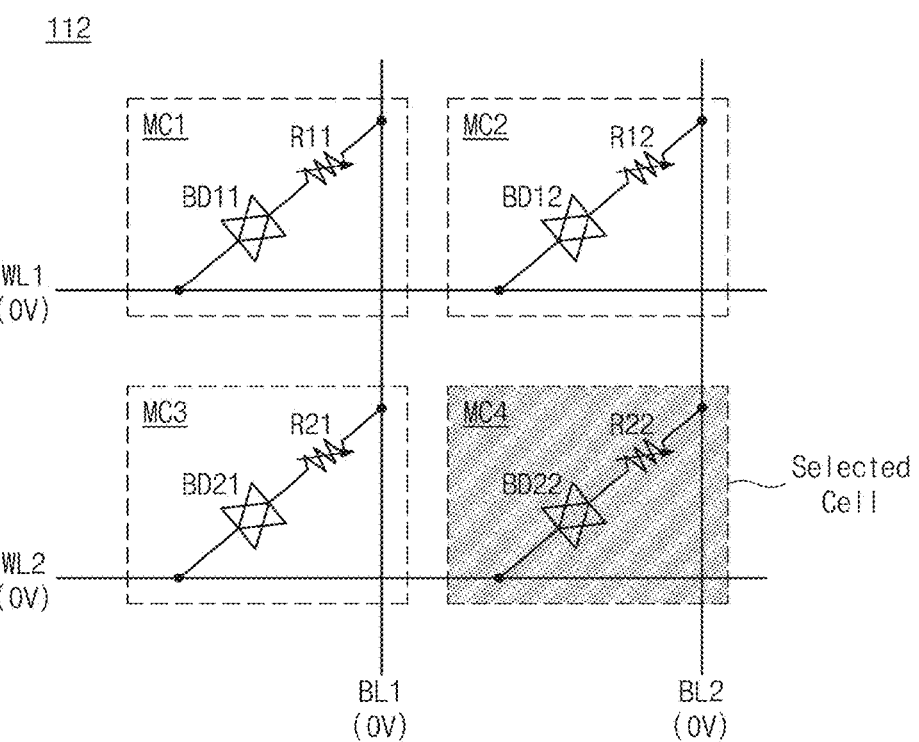
FIG. 4 is a circuit diagram illustrating a state in which a word line and a bit line of a cool zone are discharged in a stand-by state, according to an embodiment of the inventive concept.

FIG. 4 is a circuit diagram illustrating a state in which word lines and bit lines of cool zone 112 are discharged in a stand-by state, according to an embodiment of the inventive concept. A bias state of word lines WL1 and WL2 and bit lines BL1 and BL2 of four memory cells MC1, MC2, MC3, and MC4 included in cool zone 112 will be described with reference to FIG. 4. However, all memory cells included in cool zone 112 may be controlled in a manner that will be described below.

In the stand-by state, the word lines WL1 and WL2 and the bit lines BL1 and BL2 of cool zone 112 may be maintained at the ground voltage Vss or 0 V. Here, an embodiment is described wherein a discharge state of the word lines WL1 and WL2 and the bit lines BL1 and BL2 corresponds to the ground voltage Vss or 0 V, but embodiments of the inventive concept may not be limited thereto. The discharge state indicates the case where the word lines WL1 and WL2 and the bit lines BL1 and BL2 are biased with a specific voltage lower in level than the precharge voltage Vpre.

It may be the case that no potential difference exists between a word line and a bit line of each memory cell of cool zone 112 that is maintained at the discharge state. That is, in the case of a memory cell MC1, voltages of the bit line BL1 and the word line WL1 may be 0 V.

Afterwards, it is assumed that a request for an access to a memory cell (e.g., MC4) of cool zone 112 is made. First, a bit line and a word line of a tile in which the selected memory cell MC4 is included are precharged. After the precharging is completed, a pulse to be supplied to the selected memory cell MC4 may be provided to the bit line BL2.

Figure 5:
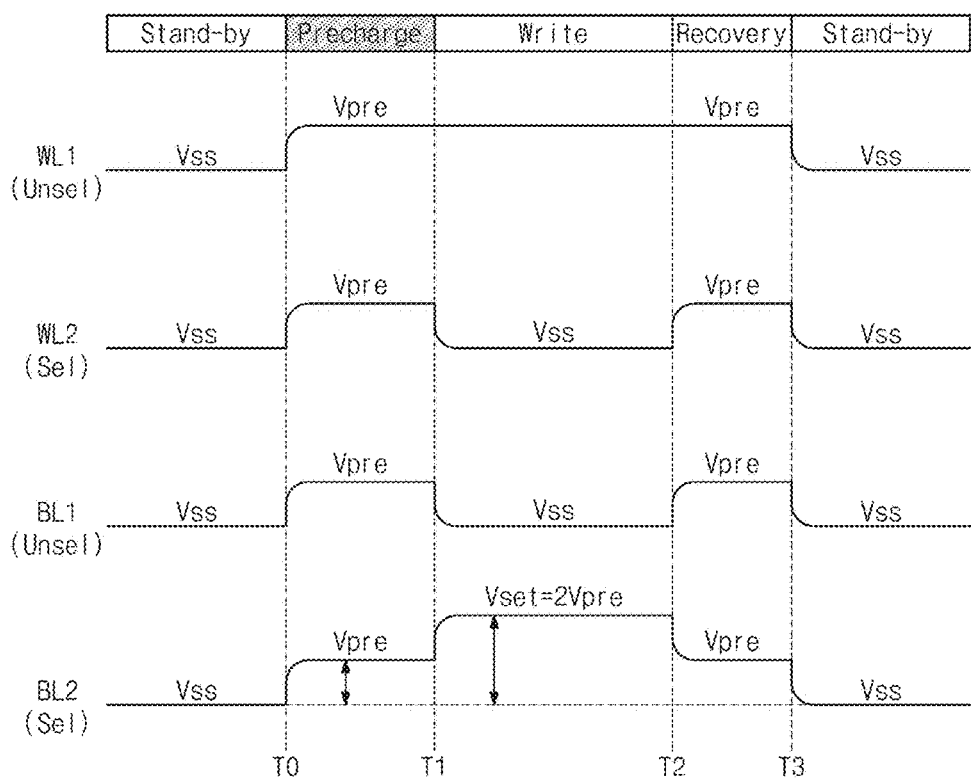
FIG. 5 is a timing diagram illustrating a method of controlling voltages of word lines and bit lines upon accessing a cool zone illustrated in FIG. 4.

FIG. 5 is a timing diagram illustrating a method of controlling voltages of word lines and bit lines upon accessing a cool zone illustrated in FIG. 4. Referring to FIG. 5, voltages of an unselected word line WL, a selected word line WL2, an unselected bit line BL1 and a selected bit line BL2 of an access-requested cool zone 112 in each mode are illustrated. Here, it is assumed that a state before a point in time T0 is a stand-by state.

In the stand-by state, all the word lines WL1 and WL2 and all the bit lines BL1 and BL2 of cool zone 112 may be maintained at the ground level Vss. Here, the ground level Vss may be 0 V. Afterwards, a write command for performing a write operation on cool zone 112 may be provided from the outside of phase change memory device 100.

In this case, at the point in time T0, control logic 170 (refer to FIG. 1) may perform a precharge operation on a selected tile or bank of cool zone 112. That is, control logic 170 performs a control operation such that the word lines WL1 and WL2 and the bit lines BL1 and BL2 of the selected tile or bank are precharged with the precharge voltage Vpre generated from voltage generator 180. Then, voltages of the word lines WL1 and WL2 and the bit lines BL1 and BL2 of the selected area of cool zone 112 may rise up to the precharge voltage Vpre which is greater than the ground level Vss.

At a point in time T1 when the precharging is completed, data is written in the selected memory cell MC4. For example, the unselected word line WL1 is controlled to maintain the precharge voltage Vpre. A voltage of the unselected bit line BL1 transitions to the ground level Vss at this point in time. In addition, a voltage of the selected bit line BL2 may increase to a write voltage Vset (=2 Vpre) that is higher in level than the precharge voltage Vpre. A voltage of the selected word line WL2 transitions to the ground level Vss. When a write current corresponding to a set pulse is provided to the selected word line WL2 in this state, a variable resistor R22 of the selected memory cell MC4 may be set to a set state.

At a point in time T2 when data is completely written, a recovery operation may be performed. That is, voltages of the word lines WL1 and WL2 and the bit lines BL1 and BL2 may be recovered to the precharge level Vpre. However, in another embodiment, the recovery procedure may be omitted.

At a point in time T3 when the write or recovery operation is completed, the word lines WL1 and WL2 and the bit lines BL1 and BL2 are set to have the ground level Vss. That is, voltages of the word lines WL1 and WL2 and the bit lines BL1 and BL2 may be recovered to a stand-by state voltage.

A method of controlling bit lines and word lines of the cool zone 112 is described above. There is a need for a precharge operation (corresponding to a time period from T0 to T1) to access a memory cell included in cool zone 112. Accordingly, a delay may be inevitable upon accessing cool zone 112. However, it may be possible to markedly reduce potential current leakage in a selection circuit by managing cool zone 112. Potential power consumption of phase change memory device 100 may be reduced through management of cool zone 112.

Figure 6:
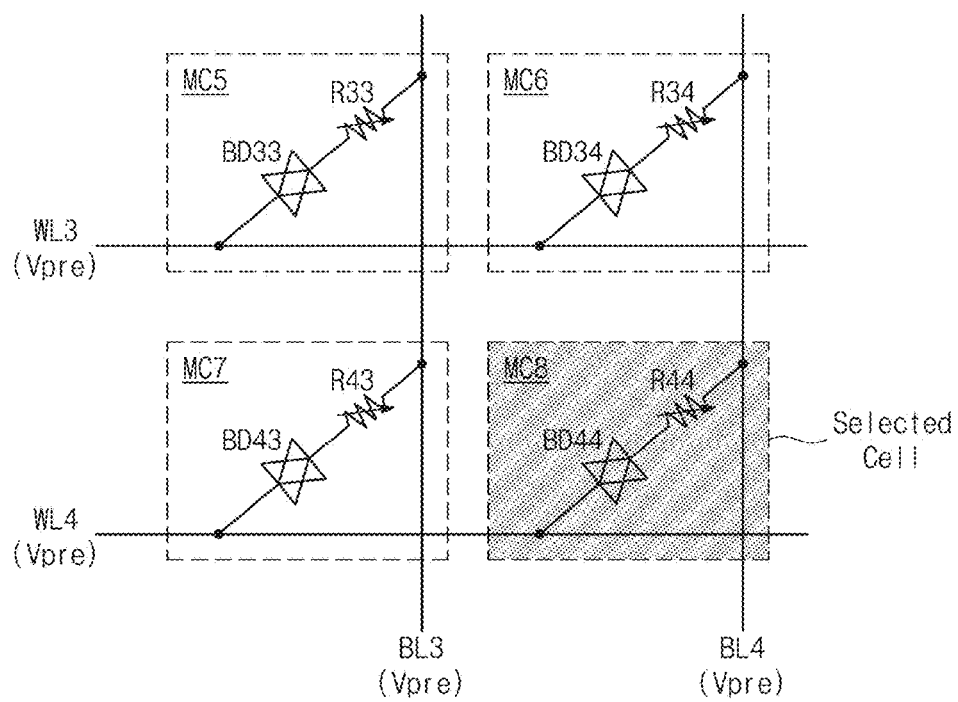
FIG. 6 is a circuit diagram illustrating a state in which a word line and a bit line of a hot zone are precharged in a stand-by state, according to an embodiment of the inventive concept.

FIG. 6 is a circuit diagram illustrating a state in which one or more word lines and one or more bit lines of hot zone 114 are precharged in a stand-by state, according to an embodiment of the inventive concept. A bias state of word lines WL3 and WL4 and bit lines BL3 and BL4 of four memory cells MC5, MC6, MC7, and MC8 included in hot zone 114 will be described with reference to FIG. 6. However, other memory cells included in hot zone 114 may be controlled in a manner that will be described below.

In the stand-by state, the word lines WL3 and WL4 and the bit lines BL3 and BL4 of hot zone 114 may be maintained at the precharge voltage Vpre. Accordingly, there is no need for a separate additional precharge procedure upon accessing hot zone 114. In the case of writing data in the memory cell MC8, a write bias for applying a write pulse immediately in the stand-by state may be established on the word lines WL3 and WL4 and the bit lines BL3 and BL4. This control method will be described in detail with reference to FIG. 7.

Figure 7:
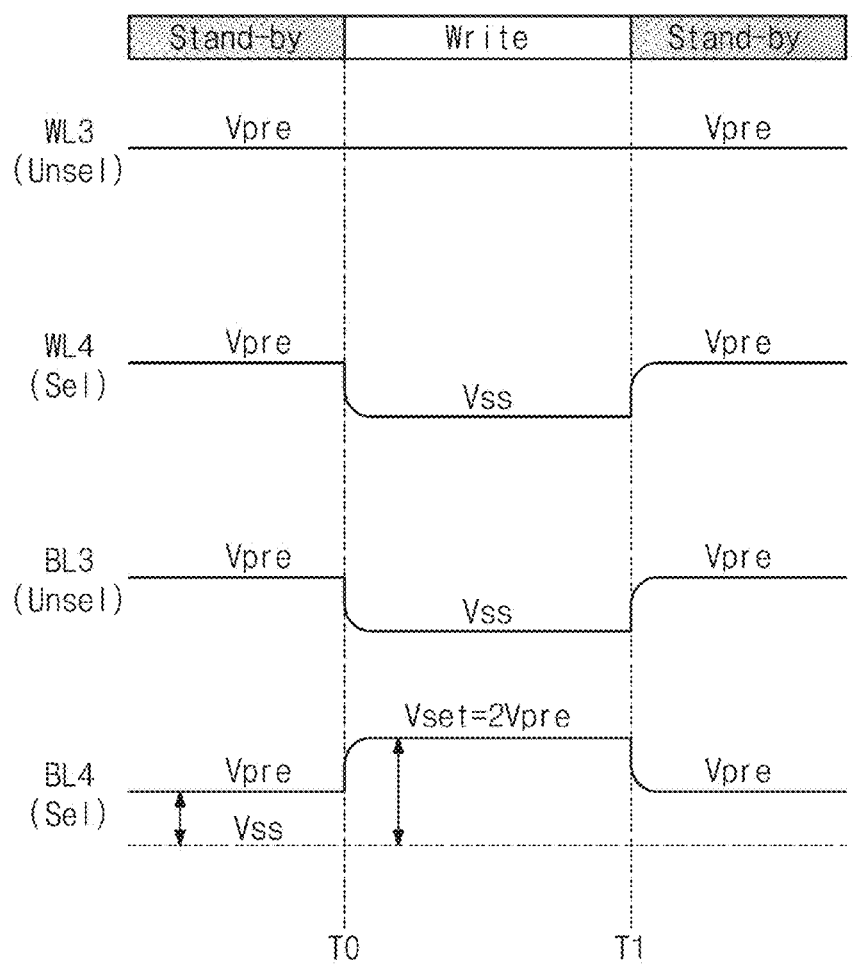
FIG. 7 is a timing diagram illustrating a method of controlling voltages of word lines and bit lines upon accessing the hot zone illustrated in FIG. 6.

FIG. 7 is a timing diagram illustrating a method of controlling voltages of word lines and bit lines upon accessing a hot zone illustrated in FIG. 6. Referring to FIG. 7, voltages of an unselected word line WL3, a selected word line WL4, an unselected bit line BL3 and a selected bit line BL4 of an access-requested hot zone 114 in each state are illustrated. Here, it is assumed that a state before a point in time t0 is a stand-by state.

In the stand-by state, all the word lines WL3 and WL4 and all the bit lines BL3 and BL4 of hot zone 114 may be maintained at the precharge voltage Vpre. Afterwards, an operation of writing data in a selected memory cell MC8 is performed when a command for writing data in hot zone 114 is provided from the outside of phase change memory device 100.

At the point in time T0, control logic 170 (refer to FIG. 1) may perform a selection operation for selecting a tile or bank of selected hot zone 114. Then, a write bias may be established on selected and unselected word lines or bit lines. The unselected word line WL3 is controlled to maintain the precharge voltage Vpre. A voltage of the unselected bit line BL3 transitions from the precharge voltage Vpre to the ground level Vss. In addition, a voltage of the selected bit line BL4 may increase to the write voltage Vset (=2 Vpre) that is higher in level than the precharge voltage Vpre. A voltage of the selected word line WL4 transitions to the ground level Vss. When a write current corresponding to a set pulse is provided to the selected word line WL4 in this state, a variable resistor R44 of the selected memory cell MC8 may be set to a set state.

At a point in time T1 when data is completely written, the word lines WL3 and WL4 and the bit lines BL3 and BL4 of hot zone 114 are recovered to a bias state corresponding to the stand-by state. That is, a recovery operation may be performed on hot zone 114. Voltages of the word lines WL3 and WL4 and the bit lines BL3 and BL4 may be all recovered to the precharge level Vpre.

A method of controlling bit lines and word lines of hot zone 114, which are maintained at a precharge state in the stand-by state, is described above. There is no need for a separate precharge procedure to access a memory cell of hot zone 114. Accordingly, operations of reading and writing data from and in hot zone 114 may be performed at a relatively high speed. However, since word lines and bit lines arranged in hot zone 114 are maintained at the precharge voltage Vpre, hot zone 114 is vulnerable to potential leakage. Accordingly, if the ratio of hot zone 114 to the whole memory area is appropriately selected, it may be possible to reduce power consumption due to a leakage current while making an access speed high.

Figure 8:
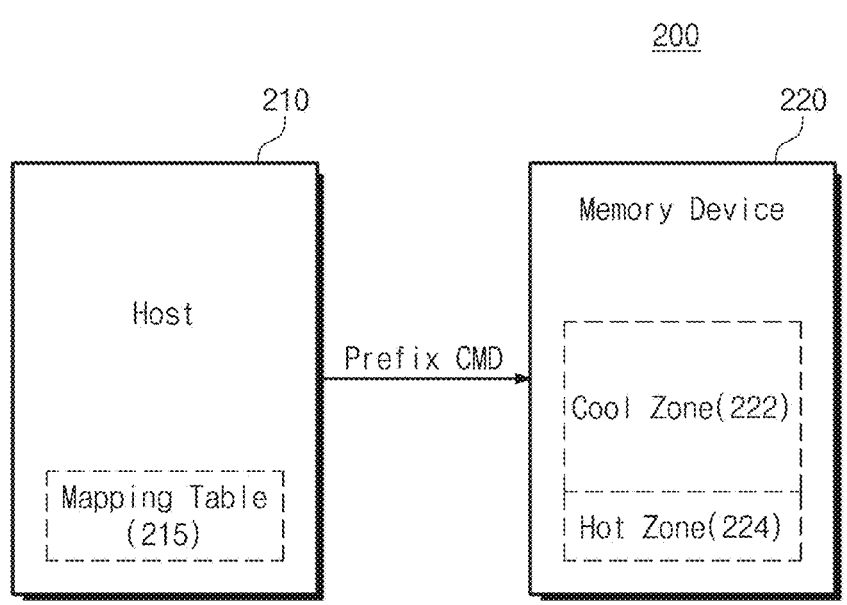
FIG. 8 is a block diagram illustrating an embodiment of a memory system.

FIG. 8 is a block diagram illustrating an embodiment of a memory system 200. Referring to FIG. 8, memory system 200 includes a host 210 and a memory device 220.

Host 210 may operate a mapping table 215 for managing address mapping of a cool zone, or first area, 222 and a hot zone, or second area, 224. Address information of cool zone 222 and hot zone 224 that are defined in memory device 220 is retained, maintained, and updated in mapping table 215. Host 210 may divide a memory area of memory device 220 into cool zone, or first area, 222 and hot zone, or second area, 224 for management. Address ranges or sizes of cool zone 222 and hot zone 224 may be selected by a user.

In the stand-by state, host 210 may apply different precharge operations to cool and hot zones 222 and 224 that are determined in advance. That is, host 210 may control memory device 220 such that word lines and bit lines of cool zone 222 are set to a discharge state in the stand-by state. In addition, host 210 may control memory device 220 such that the word lines and the bit lines of hot zone 224 are set to a precharge state in the stand-by state.

In particular, host 210 may provide a prefix command to memory device 220 upon requesting an access to cool zone 222. The prefix command is a command for precharging a word line or a bit line of a memory cell selected for an access. Host 210 may monitor addresses for various access requests and may compare the monitored addresses with addresses of mapping table 215. When an access-requested address corresponds to a cell area designated as cool zone 222 in mapping table 215, host 210 may first send the prefix command to memory device 220 before sending a read or write command thereto.

Memory device 220 may be configured the same as or similar to phase change memory device 100 of FIG. 1. Memory device 220 may divide a cell array into cool zone 222 and hot zone 224 for management. Memory device 220 may include a plurality of phase change memory cells. Each phase change memory cell includes a variable resistance element and a selection element implemented with a bidirectional switch. Memory device 220 maintains voltages of bit lines and word lines of cool zone 222 at a discharge state in the stand-by state. That is, the word lines and the bit lines of the memory cells included in cool zone 222 remain at the ground level Vss or 0 V in the stand-by state. In contrast, word lines and bit lines which are connected to memory cells that belong to hot zone 224 remain at the precharge state even in the stand-by state. That is, the word lines and bit lines of the memory cells included in hot zone 224 may be controlled to maintain the precharge voltage Vpre in the stand-by state.

Memory device 220 may precharge one or more bit lines and a word line of one or more selected memory cells belonging to cool zone 222 in response to the prefix command Afterwards, memory device 220 may receive a read or write command for reading or writing to or from one or more selected memory cells of precharged cool zone 222.

According to above-described memory system 200, host 210 may manage cool zone 222 and hot zone 224 by using mapping table 215. When host 210 accesses a memory cell belonging to cool zone 222, host 210 may make use of the prefix command for a precharge operation on the memory cell to be accessed.

Figure 9:
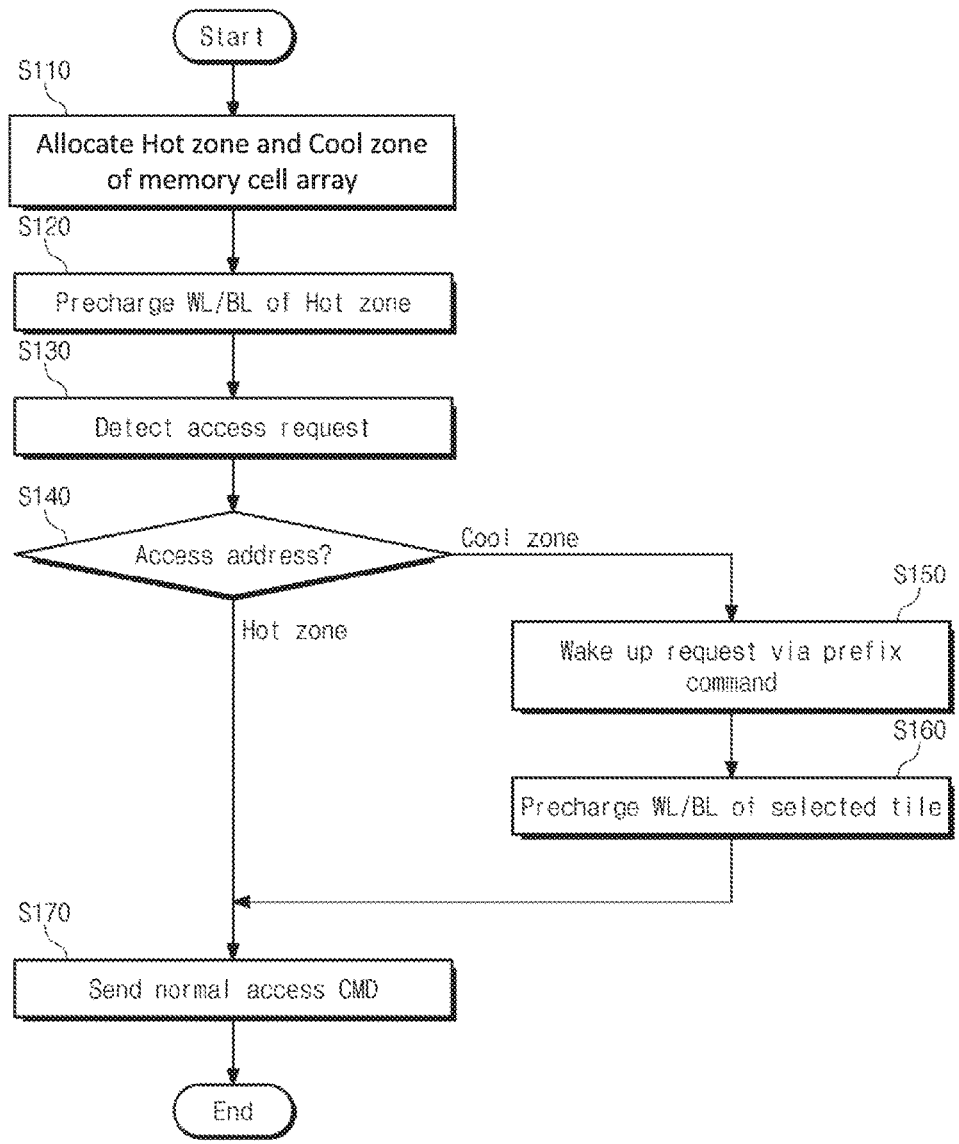
FIG. 9 is a flowchart illustrating an operation of the memory system of FIG. 8.

FIG. 9 is a flowchart illustrating an operation of memory system 200 of FIG. 8. Referring to FIGS. 8 and 9, host 210 may provide memory device 220 with the prefix command for precharging a selected memory area, based on whether an access-requested address corresponds to cool zone 222.

In operation S110, host 210 allocates cool zone 222 and hot zone 224 of memory device 200. Allocation of cool zone 222 and hot zone 224 may be defined by an operating feature of memory device 220 or settings of a user. Host 210 may manage addresses of cool zone 222 and hot zone 224 by using mapping table 215.

In operation S120, host 210 may control memory device 220 such that the word lines and the bit lines of a memory area allocated to hot zone 224 are precharged. In addition, host 210 may control memory device 220 such that the word lines and the bit lines of a memory area allocated to cool zone 222 are discharged to a level of the ground voltage Vss. Memory device 220 may establish the bit lines and the word lines of cool zone 222 at the ground level Vss under control of host 210. Also, memory device 220 may establish the word lines and the bit lines of hot zone 224 at the precharge voltage Vpre, greater than ground level Vss.

In operation S130, host 210 may detect a request for an access to memory device 220. In this case, host 210 may detect an access address corresponding to the access request for writing or reading data into or from memory device 220. Host 210 compares the detected address with an address of mapping table 215.

In operation S140, if the access-requested address corresponds to hot zone 224 in mapping table 215, the process proceeds to operation S170. In operation S140, if the access-requested address corresponds to cool zone 222 in mapping table 215, the process proceeds to operation S150.

In operation S150, host 210 may provide memory device 220 with the prefix command for waking up an area of selected cool zone 222.

In operation S160, memory device 220 may perform a wake-up operation on the area of cool zone 222 in response to the prefix command of host 210. The wake-up operation means an operation of precharging one or more bit lines and one or more word lines of a selected memory area with the precharge voltage Vpre. If the wake-up operation is completed, memory device 220 may provide host 210 with a complete message indicating that the prefix command is processed. However, it should be well understood that the procedure for providing the complete message may be omitted.

In operation S170, host 210 may send a write command or a read command for accessing an area of cool zone 222 precharged by the wake-up operation, to memory device 220.

According to an embodiment, an operational protocol of memory device 220 and host 210, in which a hot zone and a cool zone are respectively maintained at a precharge state and a discharge state in the stand-by state, is described above. When host 210 accesses cool zone 222, host 210 may provide the separate prefix command for wake-up to memory device 220 prior to a normal access command Here, the prefix command is only an example, and it should be well understood that it is possible to control the wake-up operation by using another form such as a control signal.

Figure 10:
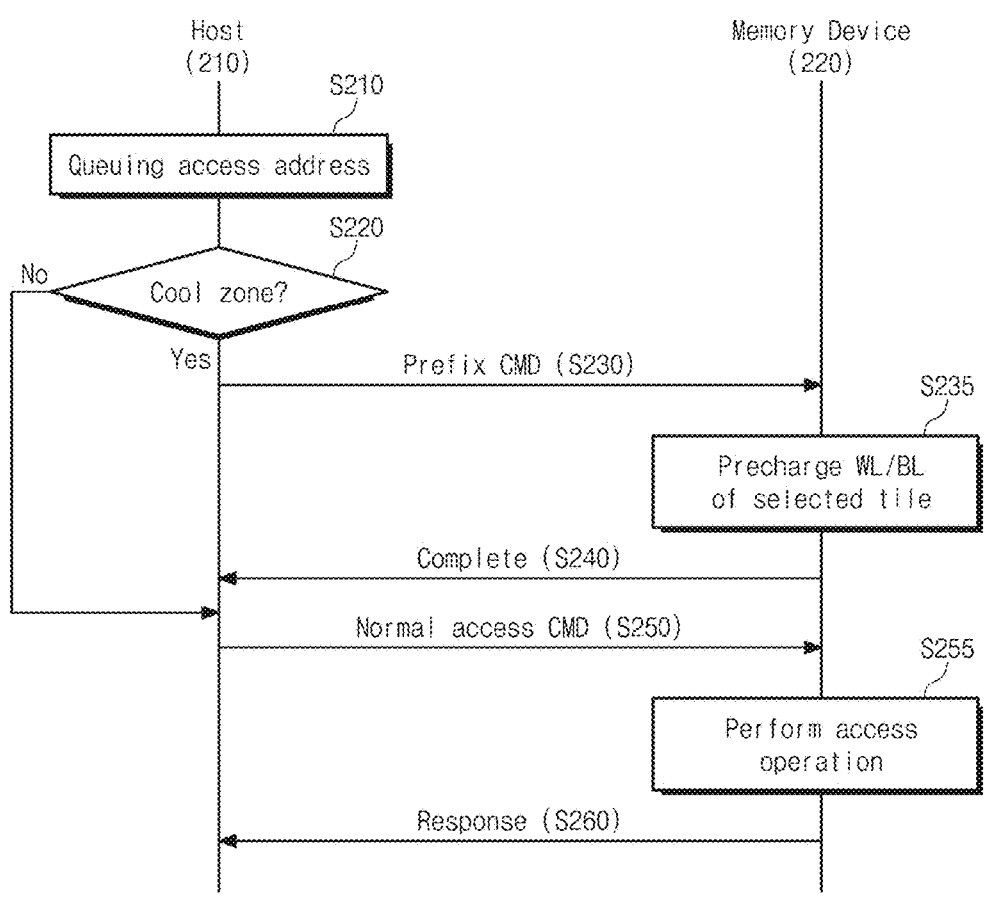
FIG. 10 is a drawing illustrating operations of a host and a memory device for execution of the processing procedure of FIG. 9.

FIG. 10 is a drawing illustrating operations of host 210 and memory device 220 for execution of the processing procedure of FIG. 9. Referring to FIG. 10, host 210 may monitor a request for an access to memory device 220 and may access memory device 220 based on the result of monitoring the request.

In operation S210, host 210 detects a request for an access to memory device 220 and obtains an access address to be provided when access request is made. Host 210 may compare the access address with an address managed in mapping table 215.

In operation S220, host 210 may determine whether the access address is an address corresponding to cool zone 222 defined in mapping table 215 or corresponding to hot zone 224 defined therein.

If the access address corresponds to cool zone 222, in operation S230, host 210 sends the prefix command for wake-up to memory device 220.

In operation S235, memory device 220 may precharge one or more bit lines and one or more word lines of an area of cool zone 222 access-requested by host 210 with the precharge voltage Vpre. In operation S240, memory device 220 may send a complete signal or data to host 210 to provide notification that the word line(s) and the bit line(s) are completely precharged.

In operation S250, host 210 may send a normal access command for accessing a selected memory area to memory device 220. Then, in operation S255, memory device 220 may perform an access operation, such as a read operation or a write operation, on the selected memory area. In operation S260, memory device 220 may inform host 210 that the requested access operation is completed.

In operation S220, if the access address access-requested by host 210 corresponds to hot zone 224 instead of cool zone 222, the process proceeds to operation S250, in which a normal access command is used without a separate wake-up procedure.

An operational protocol in which the prefix command is used to operate memory device 220, of which a memory area is divided into a cool zone and a hot zone for management, is briefly described above. However it should be understood that in other operational protocols, memory device 200 may automatically perform a wake-up operation without using the prefix command in response to a request for an access to cool zone 224. That is, when an access request corresponding to cool zone 224, memory device 220 may automatically precharge a bit line and a word line of an access-requested area without intervention of host 210.

Figure 11:
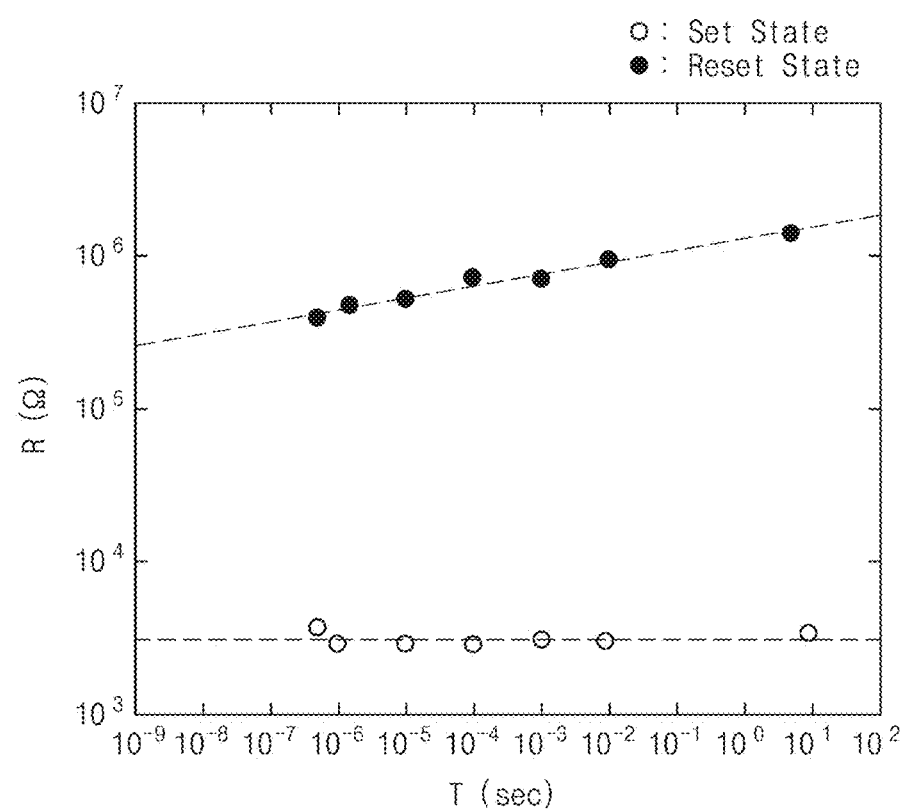
FIG. 11 is a graph briefly illustrating a resistance drift characteristic of a memory cell, according to an embodiment of the inventive concept.

FIG. 11 is a graph briefly illustrating a resistance drift characteristic of a memory cell, according to an embodiment of the inventive concept. FIG. 11 illustrates how resistance varies with time lapse after a write operation of a variable resistance element having an amorphous state.

Resistance of the variable resistance element R may increase as time progresses due to various factors. In particular, as time goes on, a resistance value corresponding to a reset state becomes markedly greater as an initial resistance value of the variable resistance element becomes greater. The abscissa of the graph represents a time that elapses after a memory cell is programmed. The ordinate of the graph represents a resistance value of a memory cell. As illustrated in FIG. 11, after the variable resistance element R is programmed to the reset state, a resistance value of the variable resistance element R is not maintained at a fixed value, but it increases over time. In a multi-level cell, a characteristic of the resistance element makes the data read margin small. Accordingly, data that is read after programming is made and time elapses may include an error.

Here, a resistance drift characteristic is described by using a single level memory cell corresponding to one of a set state and reset state as an example. However, a variation in resistance over time acts as a factor that prevents a stable read operation. Accordingly, there are being developed various technologies for addressing reduction in the data read margin due to the resistance drift characteristic. In particular, write data may be retained in a write buffer during a time tWTR needed for resistance drift to occur after data is written in a phase change memory cell. In this case, data retained in the write buffer is output if a read request is made within the resistance drift time tWTR. A capacity of the write buffer may be determined in consideration of the resistance drift time tWTR and a bandwidth of a data input channel to retain write data in the write buffer during the resistance drift time tWTR.

Figure 12:
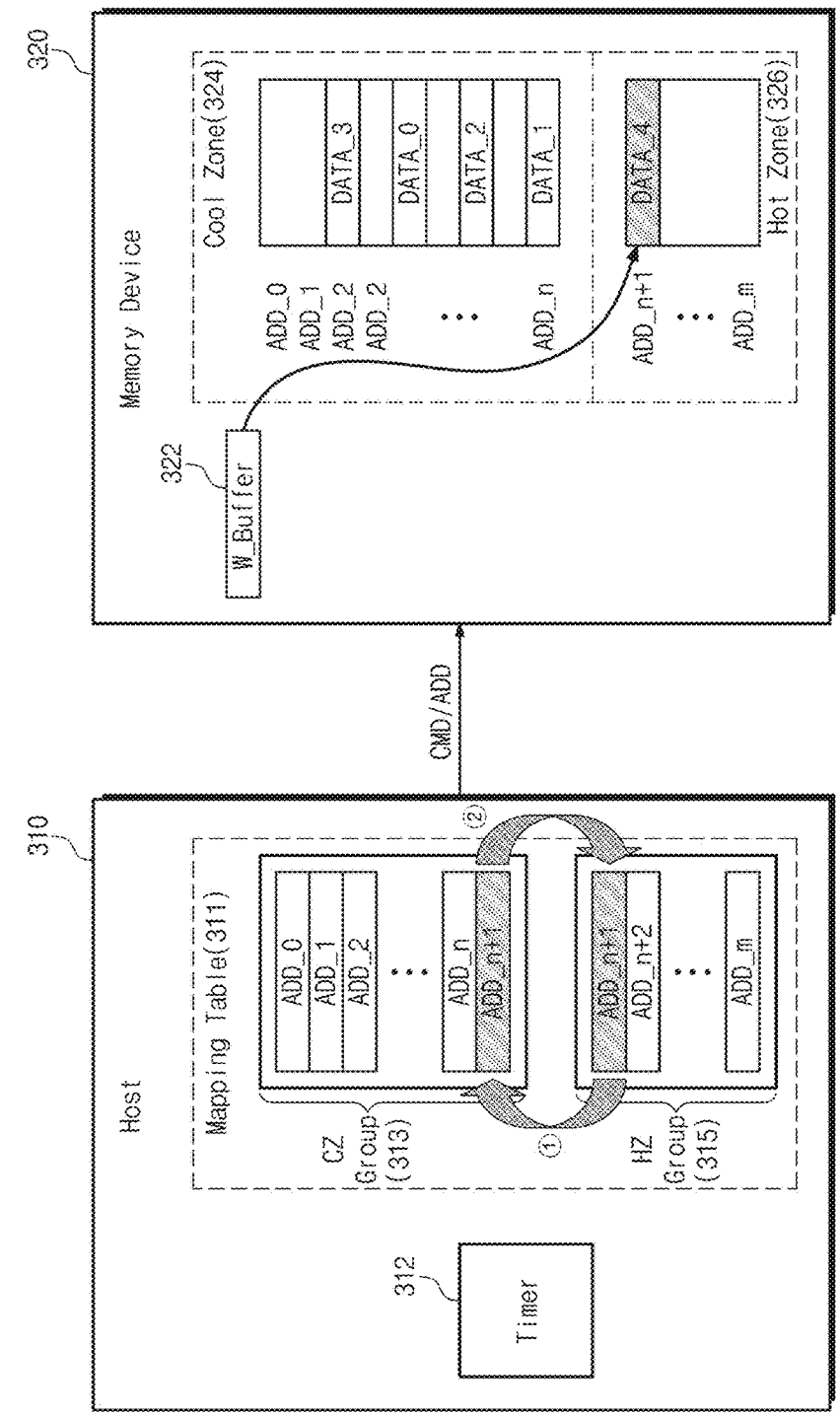
FIG. 12 is a block diagram illustrating an embodiment of a memory system.

FIG. 12 is a block diagram illustrating an embodiment of a memory system. Referring to FIG. 12, a memory system 300 includes a host 310 that calculates a lapse of the resistance drift time tWTR and a memory device 320 that applies different precharge schemes to hot and cool zones in a stand-by state. Memory device 320 includes a write buffer 322 that does not need to consider the resistance drift time tWTR because of mapping management of host 310.

Host 310 operates a mapping table 311 in which addresses of memory device 320 are mapped to be classified into a cool zone group 313 and a hot zone group 315. Mapping table 311 may be stored and managed in, for example, a main memory or an auxiliary memory of host 310. Host 310 may allocate an address of write data to any one of a hot zone 326 or a cool zone 324 of memory device 320. For example, host 310 may allocate an address of hot zone 326 of memory device 320 to write data that is frequently accessed. Host 310 may write the address of the data allocated to hot zone 326 in hot zone group 315 of mapping table 311 for management. In contrast, host 310 may allocate an address of cool zone 324 of memory device 320 to write data that is not frequently accessed, or not as frequently accessed as write data which is stored at addresses which are allocated to hot zone 326. Host 310 may write the address of the data allocated to cool zone 324 in cool zone group 313 of mapping table 311 for management.

Host 310 first sends the prefix command for wake-up to memory device 320 to access cool zone 324, as described with reference to FIG. 8. In contrast, upon accessing hot zone 326, host 310 may provide a write or read command to memory device 320 without the prefix command In an embodiment, when host 310 writes data in hot zone 326, host 310 provides a write command, address, and write data to memory 320. After write confirm, host 310 remaps write address ADD_n+1 registered in hot zone group 315 onto cool zone group 313. In addition, host 310 may calculate a time tWTR (hereinafter referred to as a "drift time") when resistance drift progresses, by using a timer 312. The process is marked in FIG. 12 by a reference numeral ①.

If the drift time tWTR elapses after the write confirm is determined by timer 312, host 310 may return the write address ADD_n+1, which is managed in cool zone group 313, to hot zone group 315 again. The process is marked by a reference numeral ②. That is, even though data is written in hot zone 326, host 310 may manage memory cells of hot zone 326 in the same manner as memory cells of cool zone 324 before the drift time tWTR elapses.

Memory device 320 may temporarily store write-requested data in a write buffer 322 and may write the write data in a memory area of an address designated by host 310. Memory device 320 may be first provided with the prefix command to perform a wake-up operation when an access to cool zone 320 is requested. Memory device 320 may perform a read or write operation after a bit line and a word line are completely precharged in response to the prefix command.

According to an embodiment, memory device 320 only needs the prefix command upon accessing cool zone 324 without a function or a separate buffer capacity that is determined in consideration of the drift time tWTR. The reason is that written data does not need to be retained in write buffer 322 during the drift time tWTR of a write-completed memory cell. Accordingly, it may be possible to reduce overhead corresponding to a capacity of write buffer 322 for providing reliability during the drift time tWTR of a memory cell.

According to an embodiment, memory system 300 may change address mapping of data written in hot zone 326 so as to be managed in cool zone group 313 during the drift time tWTR and may restore the address mapping so as to be managed in hot zone group 315 after the drift time tWTR. Accordingly, it may be possible to reduce a buffer capacity of memory device 320 for providing reliability during the drift time tWTR.

Figure 13:
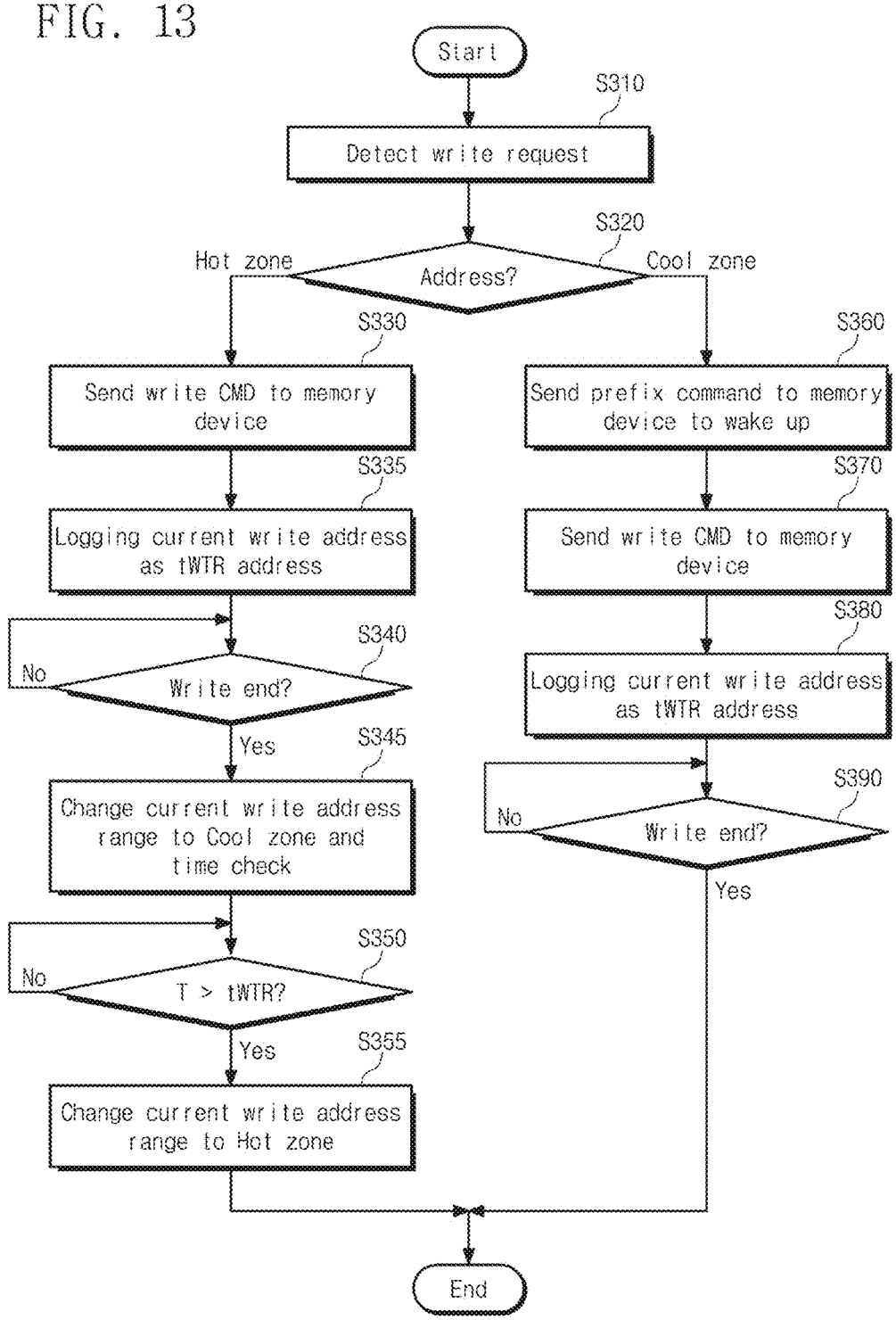
FIG. 13 is a flowchart briefly illustrating a write operation of the memory system of FIG. 12.

FIG. 13 is a flowchart briefly illustrating a write operation of a memory system of FIG. 12. Referring to FIG. 13, memory system 300 may markedly reduce a burden due to a configuration or an additional function for the drift time tWTR in memory device 320.

In operation S310, host 310 may detect a request for writing data in memory device 320. Host 310 may be a processor or a computer system that writes or reads data in or from a memory device. Alternatively, host 310 may be a memory controller for providing interfacing between another external device and memory device 320.

In operation S320, host 310 determines whether an address of write-requested data corresponds to any one of cool zone 324 and hot zone 326 of memory device 320. That is, host 310 may determine whether an address (e.g., ADD_n+1) of the write-requested data belongs to cool zone group 313 or hot zone group 315 in current mapping table 311. A branch in the write operation may be followed according to a mapping state of a write address. If the write address is mapped onto a hot zone, the process proceeds to operation S330. If the write address is mapped onto a cool zone, the process proceeds to operation S360.

In operation S330, host 310 determines that the request is a request for writing data in the hot zone. Then, host 310 may send a write command to memory device 320 without sending the separate prefix command for wake-up.

In operation S335, host 310 logs a current write address as an address needing management of the drift time tWTR. That is, host 310 registers the write address as an address needing management of the drift time tWTR.

In operation S340, host 310 checks whether writing of data in a selected memory cell of memory device 320 is completed. Host 310 may determine whether the writing of the data in the selected memory cell is completed, for example, by receiving a write status from memory device 320. If the writing of the data in the selected memory cell is not completed (No), host 310 waits until the writing of the data in the selected memory cell is completed. If the writing of the data in the selected memory cell is completed (Yes), the process proceeds to operation S345.

In operation S345, an address (e.g., ADD_n+1) or an address range of the write-requested data is remapped to be managed in cool zone group 313. Host 310 may calculate an elapsed time T immediately after an address of the write data is remapped onto cool zone group 313. The elapsed time T may be measured by using timer 312 that is implemented in host 310. The time T that elapses immediately after the write-requested data is written in a selected memory cell may be counted by using the timer 312. Whether the elapsed time T reaches the drift time tWTR may be detected.

In operation S350, host 310 may follow a branch in the read operation based on whether the elapsed time T is greater than the drift time tWTR. If it is determined that the elapsed time T is not greater than the drift time tWTR (No), then host 310 continues to count the elapsed time T. However, if it is determined that the elapsed time T is greater than the drift time tWTR (Yes), then the process proceeds to operation S355.

In operation S355, a write address (e.g., ADD_n+1) or an address range of selected memory cells is remapped to be managed in hot zone group 315. It is assumed that the drift time tWTR elapses after data is written in a selected memory cell. In this case, data is not problematic in reliability even though data is immediately read from the selected memory cell.

In operation S320, if it is determined that the write address corresponds to cool zone 324, the process proceeds to operation S360. In operation S360, host 310 sends the prefix command for waking up a selected memory area to memory device 320. Memory device 320 may perform a wake-up operation on the selected memory area of cool zone 324 in response to the prefix command That is, memory device 320 may precharge one or more word lines and one or more bit lines of a tile, or a memory unit that is smaller than a tile.

In operation S370, host 310 may send a write command and write data, which follows the prefix command, to memory device 320. If the wake-up operation corresponding to the prefix command is completed, host 310 may send the write command to write the write data in the selected memory area.

In operation S380, host 310 logs a current write address as an address needing management of drift time tWTR. That is, host 310 registers the write address as an address needing management of the drift time tWTR.

In operation S390, host 310 checks whether writing of data in a selected memory cell of memory device 320 is completed. Whether writing of data in a selected memory cell of memory device 320 is completed may be checked in a way to check a write status. If the writing of the data in the selected memory cell is not completed (No), host 310 waits until the writing of the data in the selected memory cell is completed. If the writing of the data in the selected memory cell is completed (Yes), the operation of writing data in cool zone 324 ends.

A manner in which when data is written in hot zone 326 is described above in which host 310 temporarily manages an address, at which data is written, in cool zone group 313 until the drift time tWTR elapses. There is no need to retain write data in write buffer 322 (refer to FIG. 12) before the drift time tWTR elapses, by using the above-described manner Accordingly, it may be possible to reduce a capacity of write buffer 322, which is costly.

Figure 14:
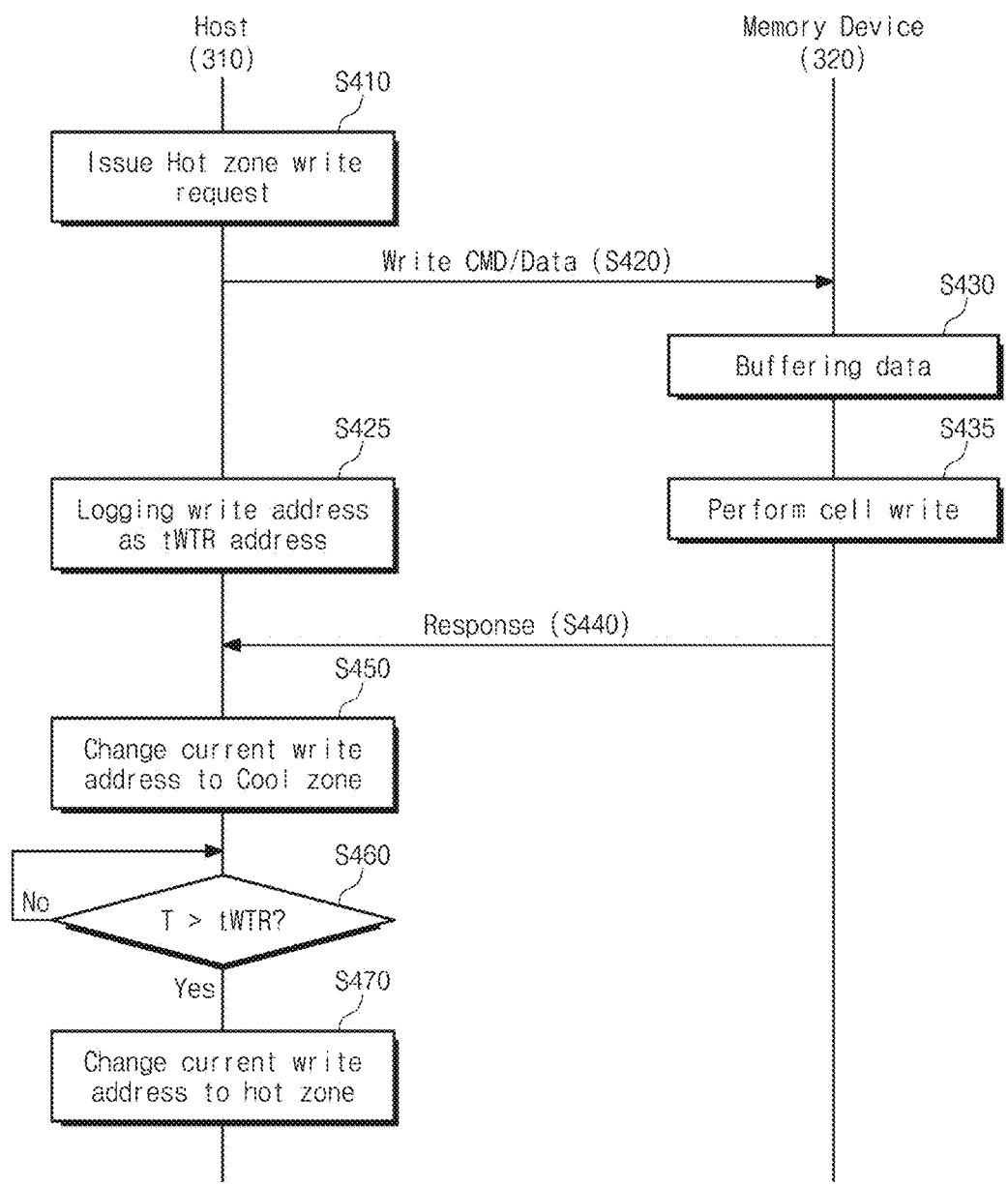
FIG. 14 is a drawing illustrating an embodiment of an operation of writing data in a hot zone area.

FIG. 14 is a drawing illustrating an embodiment of an operation of writing data in a hot zone area. Referring to FIG. 14, upon performing a write operation on a hot zone, host 310 checks whether the drift time tWTR elapses and temporarily manages an area, in which data is written, in the cool zone.

In operation S410, host 310 issues a request for writing data in the hot zone. Host 310 may compare a write address, at which write data will be written, with an address of mapping table 311. When the write address is mapped onto hot zone group 315, host 310 generates a write request for an access to hot zone 326 in which the bit lines and word lines are maintained at a precharge state. In operation S420, host 310 may send a write command and data to memory device 320. In addition, in operation S425, host 310 logs the current write address as an address needing management of the drift time tWTR. That is, host 310 registers the write address as an address needing management of the drift time tWTR.

In operation S430, memory device 320 stores the received write data in write buffer 322. In operation S435, memory device 320 may write the write data into a selected memory cell of an area of hot zone 326, which already remains at the precharge state. In operation S440, memory device 320 notifies host 310 that write data stored in write buffer 322 is completely written into the selected memory cell.

In operation S450, host 310 changes the write address, which is currently designated to hot zone group 315 in mapping table 311, to cool zone group 313 in response to the notification indicating that write data is completely written into the selected memory cell of hot zone 326. Host 310 counts the elapsed time T from a point in time when the write data is completely written into the selected memory cell.

In operation S460, host 310 checks whether the elapsed time T exceeds the drift time tWTR. If it is determined that the elapsed time T does not exceed the drift time tWTR (No), host 310 continues to count the elapsed time T. In contrast, if it is determined that the elapsed time T is greater than the drift time tWTR (Yes), the process proceeds to operation S470.

In operation S470, host 310 changes the write address, which is currently temporarily changed to cool zone group 313 in mapping table 311, to hot zone group 315.

Operations of host 310 and memory device 320 when data is written in an area of hot zone 326 are described above. Data written in hot zone 326 may be maintained to be accessible by host 310 at high speed. When a read operation is performed before the drift time tWTR elapses after the write request, host 310 manages an access-requested memory cell in cool zone group 313 of mapping table 311. Accordingly, the host may fail to access a write area at high speed before the drift time tWTR elapses after the write request.

Figure 15:
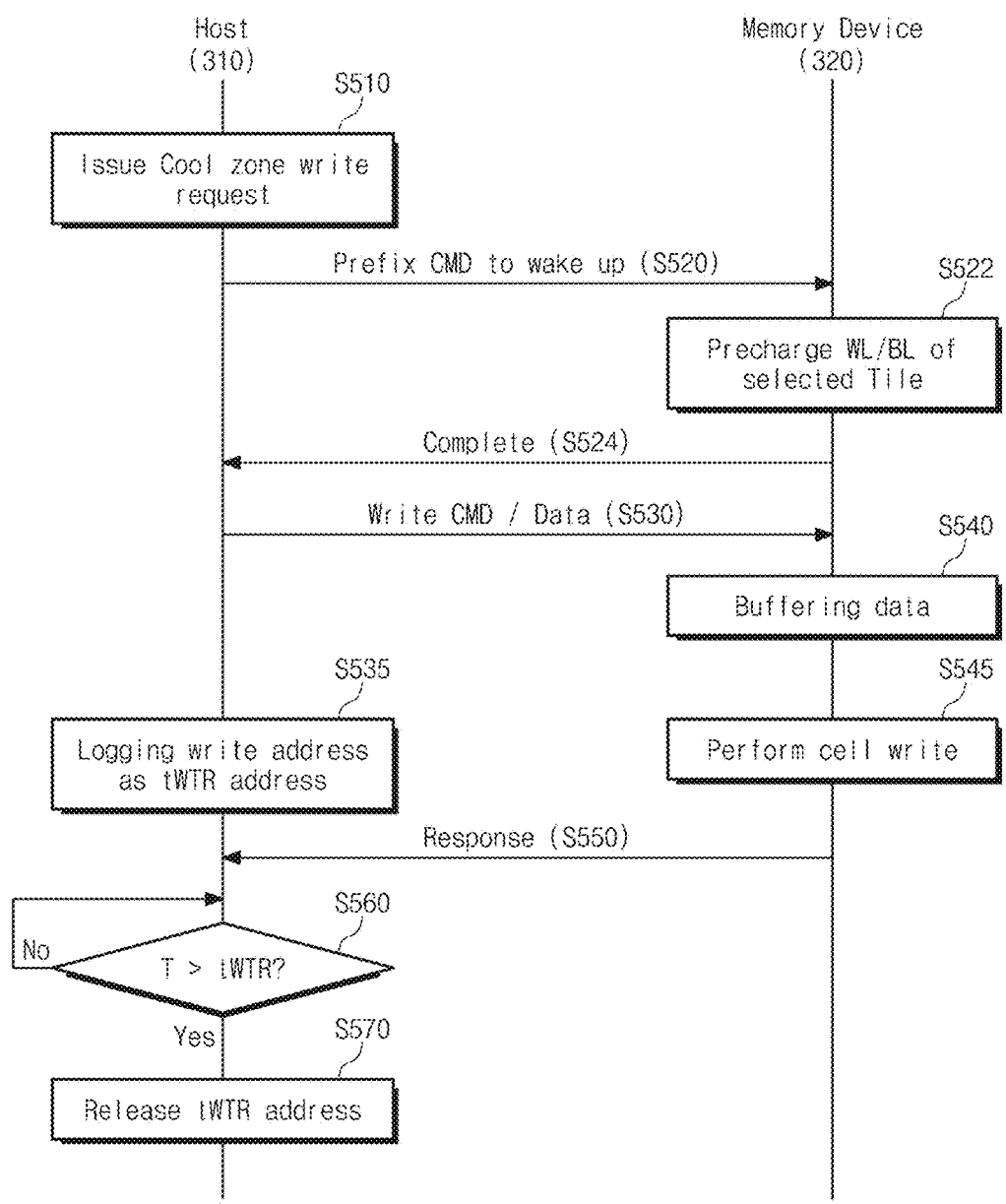
FIG. 15 is a drawing illustrating an embodiment of an operation of writing data in a cool zone area.

FIG. 15 is a drawing illustrating an embodiment of an operation of writing data in a cool zone area. Referring to FIG. 15, the prefix command for wake-up may be provided for a write operation for cool zone 324.

In operation S510, host 310 issues a request for writing data in cool zone 324. Host 310 may compare a write address, at which write data will be written, with an address of mapping table 311. When the write address is mapped on cool zone group 313, host 310 generates a write request for an access to cool zone 324. In operation S520, host 310 sends the prefix command for wake-up to memory device 320.

In operation S522, memory device 320 may precharge one or more word lines and one or more bit lines of a selected tile or bank in response to the received prefix command If the word line(s) and the bit line(s) of the selected memory area are completely precharged, then in operation S524 memory device 320 may send a wake-up complete message or signal to host 310.

In operation S530, host 310 sends a write command and write data to memory device 320. In operation S535, host 310 logs a current write address as an address needing management of the drift time tWTR. In operation S540, memory device 320 may temporarily store the write data into write buffer 322. In operation S545, memory device 320 writes the write data stored in write buffer 322 into a selected memory cell. In operation S550, memory device 320 notifies host 310 that the write data stored into write buffer 322 is completely written into the selected memory cell.

In operation S560, host 310 checks whether the elapsed time T is greater than the drift time tWTR. If it is determined that the elapsed time T does not exceed the drift time tWTR (No), host 310 continues to count the elapsed time T. In contrast, if it is determined that the elapsed time T is greater than the drift time tWTR (Yes), the process proceeds to operation S570. In operation S570, host 310 releases logging of the write address that is currently logged for management of the drift time tWTR.

An operation in which data is written in cool zone 324 of memory system 300 is described above. A time delay for wake-up may be inevitable upon writing data in cool zone 324.

Figure 16:
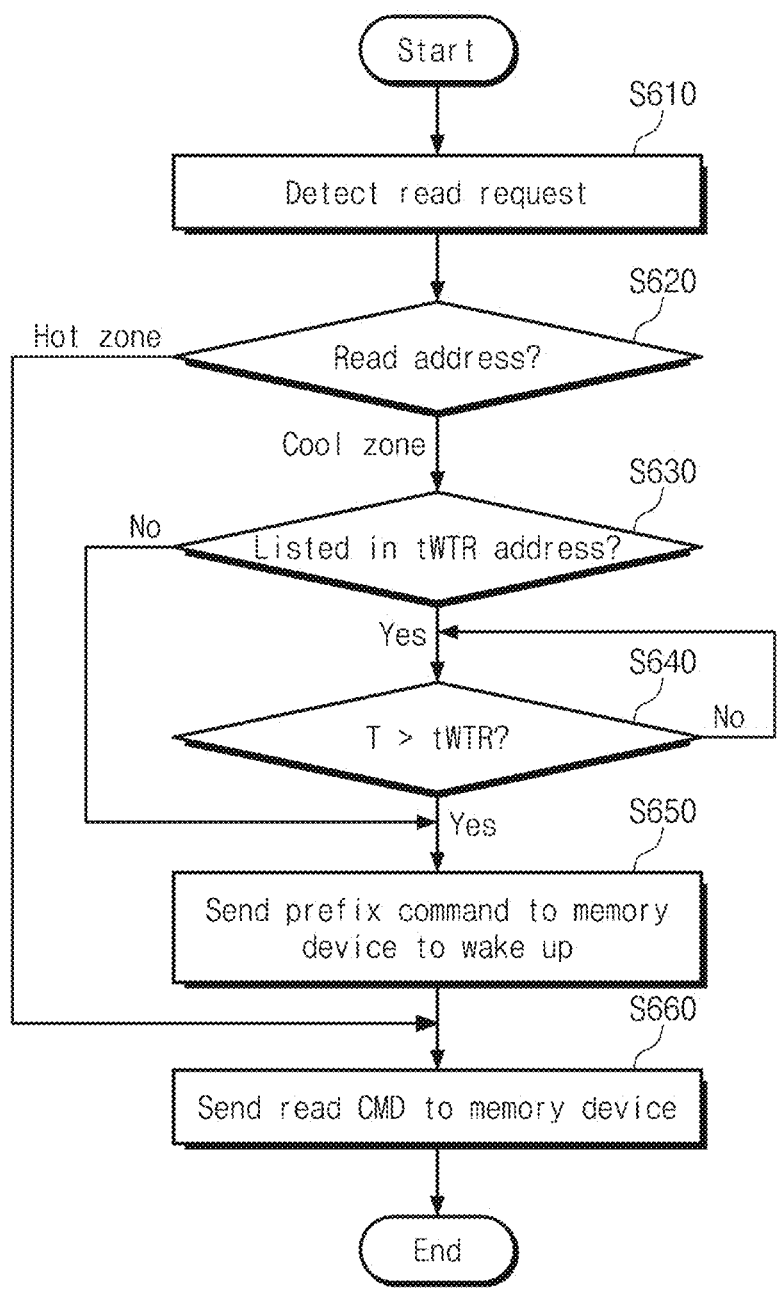
FIG. 16 is a flowchart illustrating a read operation of an embodiment of a memory system.

FIG. 16 is a flowchart illustrating an embodiment of a read operation of memory system 300. Referring to FIG. 16, host 310 may check whether the drift time tWTR has elapsed and may change address mapping of mapping table 311 based on the result of the checking. Accordingly, even in a read operation, host 310 may determine whether or not to allow access to a memory cell with reference to a count value of the drift time tWTR.

In operation S610, host 310 may detect a request for reading data from memory device 320. Host 310 may generate a read address for reading data written in memory device 320.

In operation S620, host 310 determines whether a read address of read-requested data corresponds to any one of cool zone 324 and hot zone 326 of memory device 320. That is, host 310 may determine whether the read address belongs to cool zone group 313 or hot zone group 315 in current mapping table 311. A branch in the read operation may be followed according to a mapping state of the read address. If the read address is mapped onto a hot zone, then the process proceeds to operation S660. If the read address is mapped onto a cool zone, then the process proceeds to operation S630.

In operation S630, host 310 checks whether the read address is logged as an address needing management of the drift time tWTR. That is, host 310 determines whether the read address corresponds to an address of a memory cell, in which data is written and of which the drift time tWTR has not elapsed. If it is determined that the read address is not logged as an address needing management of the drift time tWTR (No), then the process proceeds to operation S650. If it is determined that the read address is logged as an address needing management of the drift time tWTR (Yes), then the process proceeds to operation S640.

In operation S640, host 310 checks whether the elapsed time T that has elapsed from a point in time when data is written exceeds the drift time tWTR. A branch in the read operation may be followed according to whether the elapsed time T is greater than the drift time tWTR or not. If it is determined that the elapsed time T does not exceed the drift time tWTR (No), then host 310 continues to count the elapsed time T. However, if it is determined that the elapsed time T is greater than the drift time tWTR (Yes), then the process proceeds to operation S650.

In operation S650, host 310 sends the prefix command for waking up a selected memory area to memory device 320. Memory device 320 may perform a wake-up operation on the selected memory area in response to the prefix command. That is, memory device 320 may precharge one or more word lines and one or more bit lines of a selected tile of cool zone 324, or a memory unit which is smaller than a tile.

In operation S660, host 310 may send a read command following the prefix command to memory device 320.

A read method of memory system 300 of FIG. 12 is briefly described above. Here, data selected by the read address may correspond to data stored in cool zone 324 of memory device 320. Alternatively, data selected by the read address may be data stored in hot zone 326 of memory device 320, but it may be data that are temporarily managed in cool zone group 313 of the mapping table of host 310. That is, the read address may correspond to a memory area which belongs to a hot zone and for which the drift time tWTR has not yet elapsed.

According to an embodiment of the inventive concept, it may be possible to implement a variable resistance memory device capable of reducing the number of memory cells to be precharged in a stand-by state. In addition, a memory access method and a protocol are provided to access a cell area of the variable resistance memory device, which is not precharged. Also, it may be possible to implement a memory device capable of markedly reducing the size of a write buffer provided for accommodating a resistance drift characteristic.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A memory device, comprising:
   a plurality of word lines and a plurality of bit lines;
   a cell array connected to the plurality of word lines and the plurality of bit lines, the cell array including a plurality of memory cells each including a variable resistance element and a bidirectional selection element, the cell array having a first area including at least some of the memory cells and further having a second area including at least some others of the memory cells;
   a selection circuit which is configured to select a selected word line of the plurality of word lines and a selected bit line of the plurality of bit lines; and
   control logic configured to control the selection circuit such that in a stand-by state, the word lines and the bit lines connected to the memory cells of the first area of the cell array are maintained at a discharge state so as to have a discharge voltage, and the word lines and the bit lines connected to the memory cells of the second area of the cell array are maintained at a precharge state so as to have a precharge voltage which is greater than the discharge voltage.

2. The memory device of claim 1, wherein the control logic precharges at least one of the word lines and at least one of the bit lines connected to memory cells of the first area in response to a command for an access to one of the memory cells of the first area.

3. The memory device of claim 1, wherein when the selected bit line and the selected word line are connected to a selected memory cell of the first area, the control logic is provided with a prefix command for precharging the selected word line and the selected bit line before receiving a command for an access to the first area.

4. The memory device of claim 1, wherein the variable resistance element comprises a phase change memory element.

5. The memory device of claim 1, wherein the bidirectional selection element comprises a bidirectional diode.

6. An operating method of a memory device that comprises a plurality of memory cells each comprising a variable resistance element and a bidirectional selection element, the method comprising:
   dividing the memory cells into a first area including at least some of the memory cells and a second area including at least some other of the memory cells;
   in a standby state, discharging word lines and bit lines connected to the memory cells of the first area to a discharge voltage, and precharging word lines and bit lines connected to the memory cells of the second area to a precharge voltage which is greater than the discharge voltage;

detecting a request for an access to the memory device; and when an address included in the access request corresponds to one or more selected memory cells of the first area of the memory device:

sending to the memory device a prefix command for precharging at least one of the word lines and at least one of the bit lines connected to the one or more selected memory cells of the first area of the memory device, and sending to the memory device an access command corresponding to the access request.

7. The method of claim 6, wherein the prefix command is provided in the form of a control signal or a command.

8. The method of claim 6, wherein the variable resistance element comprises a phase change material.

9. The method of claim 6, wherein the bidirectional selection element comprises a bidirectional diode.

10. The method of claim 6, further comprising:
when the address included in the access request corresponds to one or more selected memory cells of the second area, sending the access command corresponding to the access request to the memory device without first sending the prefix command for precharging the word lines and the bit lines connected to the memory cells of the second area to the memory device.

11. The method of claim 6, further comprising, after sending the prefix command to the memory device and before sending the access command to the memory device, receiving from the memory device a message indicating that the prefix command has been processed by the memory device.

12. A memory system, comprising:
a memory device comprising a plurality of memory cells each comprising a variable resistance element and a bidirectional selection element, wherein the memory device controls the memory cells such that the memory cells are divided into a first area that remains at a discharge state in a stand-by state and a second area that remains at a precharge state in the stand-by state; and
a host configured to designate the first area and the second area by using a mapping table, wherein when write data is written into one or more selected memory cells in the second area, the host maps an address of the write data onto the first area in the mapping table during a specific time, and then remaps the address onto the second area.

13. The memory system of claim 12, wherein the mapping table comprises a first group designating one or more addresses of the first area and a second group designating one or more addresses of the second area, and
wherein the host maps the address of the write data, which is included in the second group, onto the first group during the specific time.

14. The memory system of claim 12, wherein the specific time includes a resistance drift time of the variable resistance element.

15. The memory system of claim 12, wherein the host comprises:
a counter configured to check whether the specific time has elapsed after the write data is written into the one or more selected memory cells of the second area.

16. The memory system of claim 15, wherein when a read address is included in the first area during a read operation, the host checks whether the specific time has elapsed after data is stored in a memory cell to be read, and adjusts a read point in time based on the check result.

17. The memory system of claim 16, wherein during the read operation, the host senses the memory cell to be read after data is stored in the memory cell to be read and the specific time has elapsed.

18. The memory system of claim 12, wherein when the write data is written into the one or more selected memory cells in the second area, the host sends a command for writing the write data into the one or more selected memory cells in the second area without first sending a prefix command for precharging one or more word lines and one or more bit lines connected to the selected memory cells in the second area.

19. The memory system of claim 12, wherein when data is written into one or more selected memory cells in the first area, the host sends a prefix command for precharging one or more word lines and one or more bit lines connected to selected memory cells in the first area before sending a command for writing the data into the one or more selected memory cells in the first area.

20. The memory system of claim 12, wherein the variable resistance element comprises a phase change memory element.

* * * * *